United States Patent
Park et al.

[19]

[11] Patent Number: 6,057,697
[45] Date of Patent: May 2, 2000

[54] MEASUREMENT SYSTEM FOR A SEMICONDUCTOR MANUFACTURING LINE IN WHICH A ROBOT CONVEYS WAFERS AMONG A CLUSTER OF CHECKING PARTS

[75] Inventors: Sang-ryeol Park, Suwon; Kye-won Kim, Seoul, both of Rep. of Korea

[73] Assignee: Samsung Electronics Co., Ltd., Suwon, Rep. of Korea

[21] Appl. No.: 08/929,525

[22] Filed: Sep. 15, 1997

[30] Foreign Application Priority Data

Sep. 17, 1996 [KR] Rep. of Korea ........................ 96-40445

[51] Int. Cl.[7] .................................................. G01R 31/02
[52] U.S. Cl. ........................................... 324/765; 324/760
[58] Field of Search ..................................... 324/765, 758, 324/158.1; 438/14, 17, 18; 257/40, 48; 356/400

[56] References Cited

U.S. PATENT DOCUMENTS 4,856,904   8/1989   Akagawa ................................ 356/400
5,166,603  11/1992   Hoshi ..................................... 324/758

*Primary Examiner*—Josie Ballato
*Assistant Examiner*—Minh Tang
*Attorney, Agent, or Firm*—Jones Volentine, LLP

[57] ABSTRACT

A measurement system for a semiconductor manufacturing line for measuring at least one wafer, which has gone through a specified manufacturing process includes a plurality of checking parts and a robot for conveying the wafer between the checking parts. After being loaded by the robot, the wafer goes through each checking part, and is then unloaded. The measurement apparatus is connected to a control part which is interfaced with each checking part so that when the measurement of the wafer is completed at a certain checking part, the wafer is conveyed to another checking part and to the unloading portion.

15 Claims, 2 Drawing Sheets

MEASUREMENT SYSTEM FOR A SEMICONDUCTOR MANUFACTURING LINE IN WHICH A ROBOT CONVEYS WAFERS AMONG A CLUSTER OF CHECKING PARTS

BACKGROUND OF THE INVENTION

1. Field of the Invention

The present invention relates to a measurement system for a semiconductor manufacturing line and, more particularly, to a measurement system in which each apparatus for measuring a manufactured semiconductor device is integrated into a cluster such that conveyance of a unit of wafers for measurement of various parameters can be automatically accomplished with a robot.

2. Background of the Related Art

Generally, a semiconductor device is manufactured through a variety of procedural steps. That is, in a semiconductor manufacturing line, process apparatuses perform processes such as an oxidation process, a diffusion process, a photographic process, an etching process, and an ion injection process. In addition, a measurement system and an automatic control system are provided thereon.

All the process apparatuses for the above processes are constructed such that wafers, which have gone through the process in question, can be conveyed to a measurement system so that they can undergo checking to see if there are any defects in hardware or software. Wafers which are found to have no defects are conveyed so that they can go through subsequent processing. Wafers found to have defects are conveyed to be repaired or destroyed.

A wafer which has gone through one process may need to have various measurements taken. Thus, a plurality of measurement apparatuses for the various measurements must be set up in the same manufacturing line.

Most of the measurement apparatuses have simple hardware compared with the process apparatuses themselves. However, since many measurement apparatuses are required for each process apparatus, much space is required to accommodate the measurement apparatuses.

In recent years, a measurement apparatus for measuring a wafer having a size of above 200 mm has been developed using a robot in place of tweezers to convey wafers. However, the robot is generally large, and the space it occupies enlarges the overall volume of the measurement apparatus. Therefore, when a plurality of measurement apparatuses are installed for one process, it is difficult to make efficient use of the limited space in a manufacturing line.

In addition, since the conveying distance between the measurement apparatuses is increased by the enlarged volume of the measurement apparatus, much time is wasted transferring wafers from one process apparatus to another, and it becomes difficult to convey the wafers smoothly. Furthermore, when a wafer is conveyed from one measurement apparatus to another, the wafer can become contaminated by particles in the air.

SUMMARY OF THE INVENTION

The present invention provides a measurement system for a semiconductor manufacturing line in which each measurement apparatus for measuring a manufactured semiconductor device is integrated into one cluster, thereby making efficient use of space and improving the conveying path for measurement of the wafer.

The present invention provides a measurement system of a semiconductor manufacturing line for measuring more than one wafer, which has completed a step of the manufacturing process, comprising: a measurement apparatus having a plurality of checking parts and a robot for conveying the wafer between the checking parts, whereby after being loaded by the robot and going through each checking part, the wafer is unloaded.

According to an embodiment of the present invention, the measurement apparatus is connected to a control part which is interfaced with each checking part so that when the measurement of the wafer is completed at a certain checking part, the wafer is conveyed to another checking part and then to an unloading portion.

Preferably, the measurement system further comprises a key panel having a plurality of keys used for setting a robot control environment, the key panel being connected to the control part to control the robot in response to key signal input. In addition, the robot is controlled in response to a signal input through an exterior communication line.

Preferably, the measurement system further comprises a loading cassette for storing the wafer transferred to and loaded on the measurement apparatus, and an unloading cassette for storing the wafer transferred from a checking part.

The checking parts comprise at least one of: a particle checking part, a thickness checking part, a line width checking part, and a density checking part.

According to another embodiment of the present invention, the measurement apparatus comprises: a rail interconnecting the checking parts having a position where the wafer is loaded and unloaded; a robot vehicle having a robot conveying the wafer on the rail, the vehicle running between conveying positions; and a control part for controlling the operation of the robot vehicle and the robot. The robot is designed for pivotal, swivelling, reciprocating, and up-and-down motion. The rail can accommodate a plurality of robot vehicles, wherein the robots may be placed in a standby mode by the control part while waiting for loading and unloading operations.

The measurement apparatus accommodates wafers which have completed a chemical vapor evaporation process or a diffusion process, for example.

BRIEF DESCRIPTION OF THE ATTACHED DRAWINGS

The following drawings illustrate embodiments of the invention, in which.

DETAILED DESCRIPTION OF PREFERRED EMBODIMENT

Reference will now be made in detail to the preferred embodiments of the invention, examples of which are illustrated in the accompanying drawings. Wherever possible, the same reference numbers will be used throughout the drawings to refer to the same or like parts.

Figure 1:
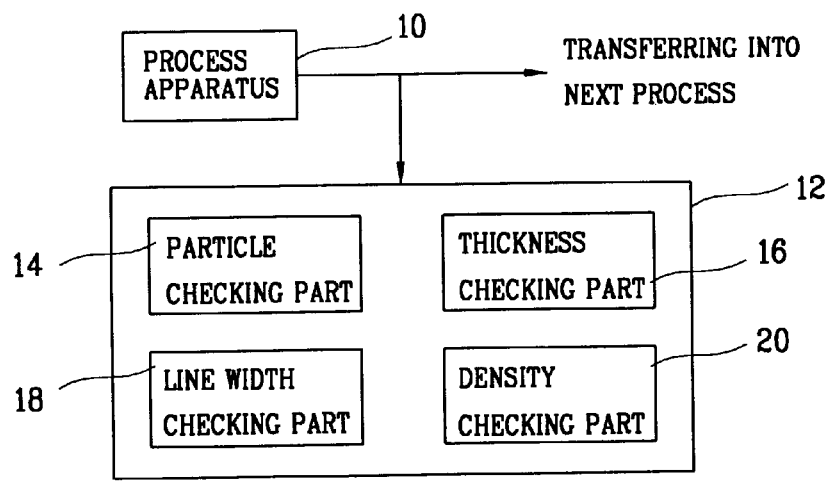
FIG. 1 is a block diagram illustrating a measurement system according to a preferred embodiment of the present invention.

FIG. 1 is a block diagram illustrating a measurement system according to a first embodiment of the present invention. The system is constructed such that a unit of wafers (not shown), which has completed a process step at a process apparatus 10, is selectively transferred to either a succeeding process apparatus (not shown) or to a measurement apparatus 12. The entire unit of wafers, or a subset of the entire unit, may be conveyed to the measurement apparatus 12, depending upon the process in question or whether the apparatus has a defect or not.

As illustrated, the measurement apparatus 12 comprises a particle checking part 14, a thickness checking part 16, a line width checking part 18, and a density checking part 20. Other types of checking parts may be utilized depending on the particular measurements to be taken.

In this embodiment, the above checking parts are integrated into one system environment, and conveyance of the wafers from the process apparatus 10 to each of the checking parts 14, 16, 18 and 20, and between each of the checking parts is accomplished by one robot.

Figure 2:
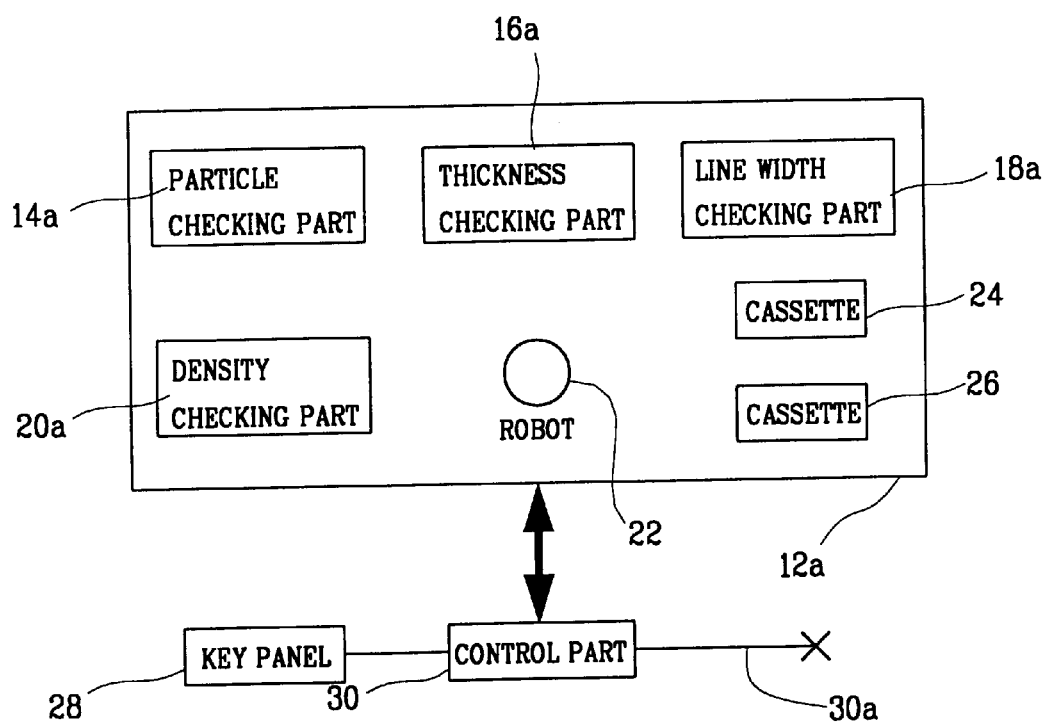
FIG. 2 is a block diagram illustrating the measurement apparatus depicted in FIG. 1 using a fixed position robot.
Figure 3:
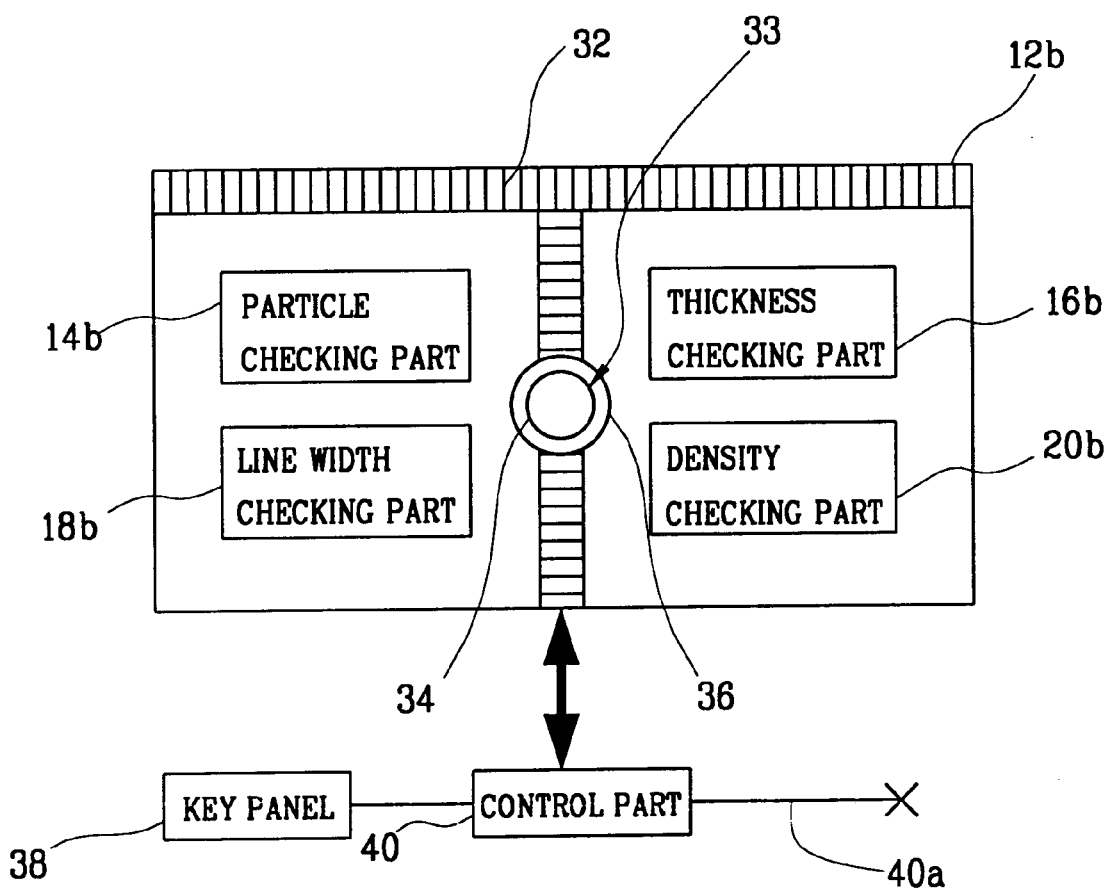
FIG. 3 is a block diagram illustrating the measurement apparatus depicted in FIG. 1 using a robot movable along a rail.

The measurement apparatus 12 can be a fixed robot-type apparatus 12a as shown in FIG. 2 or a movable robot-type apparatus 12b as shown in FIG. 3. In either of the embodiments, the measurement apparatus 12 is designed to be connected to one or more process apparatuses so as to load and unload the wafers to and from the apparatus.

Referring to FIG. 2, a block diagram illustrates a fixed robot-type apparatus 12a, which is a first embodiment of the measurement apparatus 12 in accordance with the present invention.

The fixed robot-type apparatus 12a connected to the process apparatus 10 comprises a particle checking part 14a, a thickness checking part 16a, a line width checking part 18a, a density checking part 20a, a robot 22 and wafer cassettes 24 and 26 for loading and unloading the wafers to and from the apparatus 10. Conveyance of the wafers is controlled by a control part 30 coupled to a key panel 28, to each of the checking parts 14a, 16a, 18a and 20a, and to an exterior communication line 30a. The control part 30 is interfaced with each of the above checking parts 14a, 16a, 18a and 20a to perform measurements on the wafers.

The control part 30 controls the conveyance of the wafers between the checking parts according to the status of each checking part, and further controls a wafer conveying mode, a selection of measurements to be taken for the loaded wafers, a sequence of measurements, and loading/unloading of the wafers in accordance with both a key signal input through the key panel 28 and a command input through the exterior communication line 30a.

As described above, the measurement apparatus including the above described checking parts can perform different measurements and receive wafers from various fixed process apparatuses.

The operation of the measurement apparatus 12a will be described hereinafter. For the purpose of discussing this embodiment, we will assume that the measurement apparatus 12a is connected to a chemical vapor evaporation apparatus as the process apparatus 10.

The wafers may be conveyed from the chemical vapor evaporation apparatus to the measurement apparatus 12a by a conveyer system or by an unmanned conveying vehicle. The wafers conveyed to the measurement apparatus 12a are loaded on the loading cassette 24.

If the wafers loaded on the cassette 24 have a BPSG layer on top from the chemical vapor evaporation apparatus, the required measurement items include thickness of the layer, particle contamination, and density of boron (B) and phosphorus (P).

Therefore, when data with respect to the conveyed wafers is inputted to the control part 30 through the exterior communication line 30a, the control part 30 sets up the conveying path of the wafers such that the wafers go through the particle checking part 14a, thickness checking part 16a and density checking part 20a.

According to this set up, the robot 22 conveys the wafers loaded on the cassette 24 to one of the checking parts 14a, 16a, 18a, and 20a under the control of the control part 30. The conveying order of the wafers through the checking parts is decided in accordance with the programmed order within the control part 30 and the status of each checking part.

Accordingly, when the wafer is conveyed to one of the checking parts by the robot 22, the checking part performs its measurement on the wafer. After this, the robot conveys the wafers to another checking part for another measurement. Finally, when all measurements are completed, the robot 22 unloads the wafers onto the unloading cassette 26.

In the above described process, the loading/unloading of the wafer can be performed one piece at a time or as a unit or batch of pieces according to the required measurements.

Referring to FIG. 3, a block diagram illustrates a movable robot-type apparatus 12b, which is a second embodiment of the measurement apparatus 12 in accordance with the present invention.

A rail 32 is provided between the checking parts and a position where the wafers are loaded and unloaded. A robot vehicle 36 equipped with a robot 34 is carried on the rail 32 and runs between the checking positions for conveying the wafer to the various positions.

In addition, a control part 40 is connected to each of the checking parts 14b, 16b, 18b and 20b, the robot 34, a key panel 38, and an exterior communication line 40a.

The robot 34 and the robot vehicle 36 are operated in response to the control of the control part 40. Further, the control part 40 controls the wafer conveyance according to the status of each checking part and the data input through the key panel 38 and the exterior communication line 40a.

To facilitate the conveyance of the wafers to a desired position, the robot 34 is designed to operate using various movements or motions, including pivotal (rocking forward and backward), swivelling (turning left and right), reciprocating (moving side to side), and up-and-down motion. The rail 32 can accommodate a plurality of robot vehicles 36, with each of the robots 34 in the robot vehicles 36 being capable of being switched to a standby mode 33 by the control part 40, while waiting for a particular checking part to become available.

The determination of the loading/unloading and conveying sequence of the wafers is accomplished in the same manner as the first embodiment. The control part 40 operates the robot vehicle 36 and the robot 34 to convey the wafers in accordance with the determined sequence.

When a checking part 14b, 16b, 18b and 20b to which the wafers are to be conveyed is occupied with checking other wafers, the control part 40 switches the robot 34 in the robot vehicle 36 to the standby mode 33. When the checking part is free, the robot 34 retries the conveyance of the wafers in question under control of the control part 40. Accordingly, after going through each checking part within the measurement apparatus 12b, the wafers are unloaded.

In the measurement apparatus 12b of this embodiment, a wafer loading/unloading cassette is not required since the loading/unloading operation of the wafers is accomplished within the robot vehicle 36.

The embodiments of the present invention can be applied to a diffusion process, a photographic process, and an etching process as well as to the chemical vapor evaporation process. For example, the measurement apparatus should include a particle checking part and a thickness checking part for the diffusion process. That is, to apply the system of the present invention to other types of processes, the measuring apparatus should include checking parts for the particular process in question.

While this invention has been described in connection with what is presently considered to be the most practical and preferred embodiments, it is to be understood that the invention is not limited to the disclosed embodiments, and is intended to cover various modifications and equivalent arrangements and methods included within the spirit and scope of the appended claims.

What is claimed is:

1. A measurement system for a semiconductor manufacturing line for measuring one or more wafers which have completed specified steps in a manufacturing process, comprising:

a measurement apparatus having a plurality of checking parts;

robots for conveying a wafer between said checking parts;

a loading portion and an unloading portion, wherein said wafer is loaded by said robots at said loading portion, is measured at one or more of said checking parts, and is unloaded at said unloading portion;

a rail for interconnecting said checking parts;

a plurality of robot vehicles running on said rail, said robots being mounted on said robot vehicles; and a control part for controlling operation of said robot vehicles and said robots;

wherein said robots in said robot vehicles can be switched to a standby mode by said control part.

2. The measurement system for a semiconductor manufacturing line according to claim 1, wherein said control part being interfaced with each checking part so that when a measurement of said wafer is completed at one checking part, said wafer is conveyed to another checking part and to said unloading portion.

3. The measurement system for a semiconductor manufacturing line according to claim 2, further comprising a key panel having a plurality of keys used for setting a robot control environment, wherein said key panel is connected to said control part to control said robots in response to a key signal input.

4. The measurement system for a semiconductor manufacturing line according to claim 2, further comprising an exterior communication line connected to said control part, said robots being controlled in response to a signal input through said exterior communication line.

5. The measurement system for a semiconductor manufacturing line according to claim 2, said loading portion further comprising a loading cassette for storing said wafer transferred to and loaded on said measurement apparatus, and said unloading portion further comprising an unloading cassette for storing said wafer after measurement is completed at one of said checking parts.

6. The measurement system for a semiconductor manufacturing line according to claim 2, said checking parts comprising at least one of a particle checking part, a thickness checking part, a line width checking part, and a density checking part.

7. The measurement system for a semiconductor manufacturing line according to claim 1, wherein said robots are designed for pivotal, swivelling, reciprocating, and up-and-down motion.

8. The measurement system for a semiconductor manufacturing line according to claim 1, wherein wafers can be repeatedly transferred to and from said measurement apparatus as said wafers progress through various process steps in said semiconductor manufacturing line.

9. The measurement system for a semiconductor manufacturing line according to claim 10, wherein said control part being interfaced with each of said checking parts so that when a measurement of said wafer is completed at one checking part, said wafer is conveyed to another checking part and to said unloading portion.

10. The measurement system for a semiconductor manufacturing line according to claim 10, wherein said robots are designed for pivotal, swivelling, reciprocating, and up-and-down motion.

11. The measurement system for a semiconductor manufacturing line according to claim 1, wherein said specified step in said manufacturing process is a chemical vapor evaporation step.

12. The measurement system for a semiconductor manufacturing line according to claim 11, said checking parts comprising a thickness checking part, a particle checking part, and a density checking part.

13. The measurement system for a semiconductor manufacturing line according to claim 11, wherein said specified step in said manufacturing process is a diffusion step.

14. The measurement system for a semiconductor manufacturing line according to claim 13, said checking parts comprising a thickness checking part, a particle checking part, and a density checking part.

15. The measurement system for a semiconductor manufacturing line according to claim 1, wherein said loading portion and said unloading portion are located within said robot vehicles.

* * * * *